United States … Mueller

[11] 3,934,245
[45] Jan. 20, 1976

[54] ALPHANUMERIC DISPLAY MEANS FOR COMPUTER-LINKED TYPEWRITER CONSOLES

[75] Inventor: Thomas Delbert Mueller, Orinda, Calif.

[73] Assignee: Chevron Research Company, San Francisco, Calif.

[22] Filed: Nov. 5, 1973

[21] Appl. No.: 413,115

[52] U.S. Cl. ............ 340/324 R; 340/365 R; 340/380
[51] Int. Cl.$^2$ ............................................. G06F 3/14
[58] Field of Search ......... 340/324 RM, 380, 378 R, 340/365 R, 365 C

[56] References Cited
UNITED STATES PATENTS

| | | | |
|---|---|---|---|
| 3,187,321 | 6/1965 | Kameny | 340/365 R |
| 3,644,922 | 2/1972 | James et al. | 340/380 |
| 3,670,322 | 6/1972 | Mallebrein | 340/365 C |
| 3,737,898 | 6/1973 | Cross, Jr. | 340/380 |
| 3,789,521 | 2/1974 | Way et al. | 340/380 |

*Primary Examiner*—Marshall M. Curtis
*Attorney, Agent, or Firm*—R. L. Freeland, Jr.; H. D. Messner

[57] ABSTRACT

The present invention relates to an alphanumeric display unit means for improving the identification quantities at selected key buttons of a computer-linked typewriter console through usage of light-emitting identification indicia attached adjacent to or at the selected key buttons. Each light-emitting display is in matrix format consisting of a set of fiber optic members arranged in orthogonal rows and columns. Encoding is via stencil tab means inserted in the path of light generated by incandescent bulb means in operational alignment with each set of fiber optic members.

3 Claims, 7 Drawing Figures

ALPHANUMERIC DISPLAY MEANS FOR COMPUTER-LINKED TYPEWRITER CONSOLES

FIELD OF THE INVENTION

The present invention relates to key-operated typographical machines such as typewriters and the like, and more particularly, to a computer-linked typewriter console used as an input/output (I/O) linkage for a general purpose digital computer.

BACKGROUND OF THE INVENTION

Today's different programming languages (FORTRAN, PL-1, ASSEMBLY, etc.) are often used interchangeably by operators at a common computer terminal for controlling a general purpose digital computer. The number, symbols and programming keys associated with a given programming language may require any one operator to alternate a plurality of fonts at the computer-linked typewriter console; however, as is well known, each font relates to a different layout of keyboard characters.

As font changes occur, it has been proposed to employ key buttons, each bearing a plurality of characters to aid the observer-user in more efficiently using the typewriter console. It has been further proposed to fit the key buttons with adjustable plates bearing different character indicia. However, where there are a plurality of operators-users at a common typewriter console such as found at most computer terminals, numerous alphanumeric identification plates would be needed. Therefore, the above-mentioned proposals have been found to be exceedingly awkward to implement. Also, in some cases it is desirable to "highlight" certain key buttons above those displayed at adjacent buttons owing to the importance of certain programming keys being implemented at the computer terminal. None of the prior art plates provides such features.

SUMMARY OF THE INVENTION

In accordance with the present invention, selected keyboard buttons of an I/O typewriter console linked to a general purpose digital computer are provided with a plurality of tightly fitting rigid tab frame means. Onto the frame means are fitted a highly visible, light-emitting alphanumeric display means for display of key alphanumeric indicia through selective control provided by controller switch means connected thereto. Preferably the light-emitting display means includes end array display matrices of sets of fiber optic members. Each member set is arranged in orthogonal columns and rows. Encoding of data can be relatively simple: e.g., light signals from an incandescent light source are generated by a series of parallel optical stencil tabs positioned between the light source and the sets of fiber optic members, light falling on encoding matrices being easily transmitted for display at the display matrices for observation by the observer-user, as required.

OBJECTS OF THE INVENTION

An object of the present invention is the provision of a novel, light-emitting alphanumeric display for use at a typewriter console linked to a general purpose digital computer whereby the observer-user of the typewriter console can easily identify key lever operations irrespective of the number and/or programming language employed within the linked digital computer or at the I/O typewriter console itself.

Further objects of the invention will become apparent from a detailed description of the single embodiment given by way of example and not by way of limitation, reference being made to the accompanying drawings.

DESCRIPTION OF A DETAILED EMBODIMENT

Figure 1:
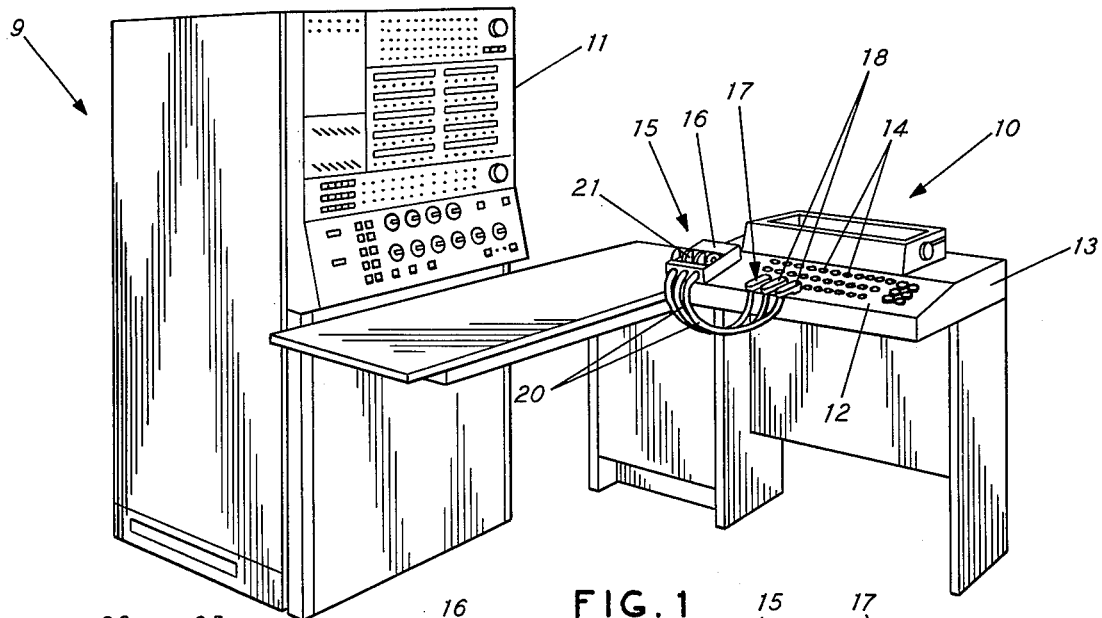
FIG. 1 is a perspective view of an I/O computer terminal which includes a typewriter console having a keyboard provided with light-emitting, alphanumeric character displays positioned at selected key buttons in accordance with the present invention.

FIG. 1 illustrates a computer terminal 9. The computer terminal 9 includes an I/O typewriter console 10 useful in linking digital information to a general purpose digital computer (not shown). Information can also be linked to the computer by I/O devices other than the typewriter console 10. For this purpose, such associated I/O devices can be housed within cabinet 11.

Typewriter console 10 is seen to comprise a keyboard 12 visible above housing 13. The observer-user utilizes key buttons 14 to depress levers (not shown) by which conventional font-paper interaction occurs while, simultaneously, the data is transmitted, after being compiled, to the general purpose digital computer. Keyboard 12 is conventionally arranged; e.g., as a series of rows and columns. Due to the fact that different programming languages used by various observer-users for computer control purposes may employ numerous characters, symbols and keys not readily interrelated, there is a definite need for indentification means for attachment to selected key buttons 14. Preferably such identification means should highlight the display irrespective of the background lighting environment at the computer terminal 9.

The present invention provides for such a display through a novel, light-emitting display unit 15 attached to the typewriter console 10. In general, the display unit 15 of the present invention comprises a controller switch unit 16 attached, say, to the housing 13 of the typewriter console 10, and an alphanumeric indicating unit 17 including a rigid frame means 18. Also of importance: transfer bundle means 20 connected between the controller switch unit 16 and the indicating unit 17. Each of the aforementioned elements will now be described in detail.

Controller Switch Unit 16

Figure 2:
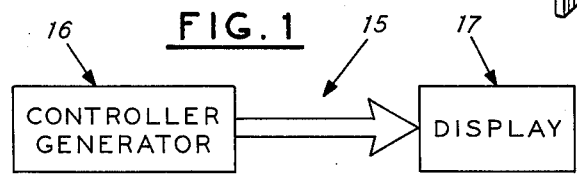
FIG. 2 is a schematic diagram of circuitry useful in the apparatus of the present invention.

As FIG. 1 illustrates, controller switch unit 16 should be placed within arm's length of the observer-user using typewriter console 10. To the broad surface of the unit is attached stencil tab means 21. Purpose: to effectuate contol of light energy being generated within the controller switch unit 16 to provide a selected set of light signals, such light signals being passed in turn via transfer bundle means 20 to the indicating unit 17 (see FIG. 2).

Figure 5:
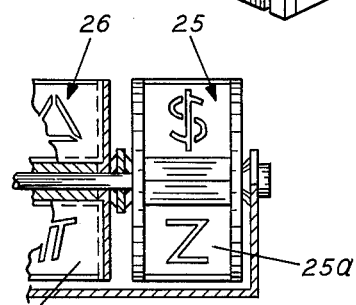
FIG. 5 is a section taken along line 5—5 of FIG. 3.
Figure 3:
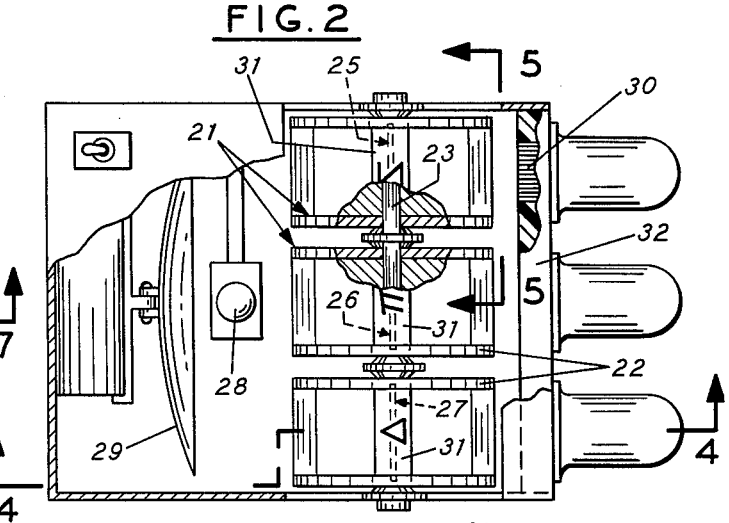
FIG. 3 is a partial cutaway of a plan view of a light generator/controller unit of the circuitry of FIG. 2.
Figure 4:
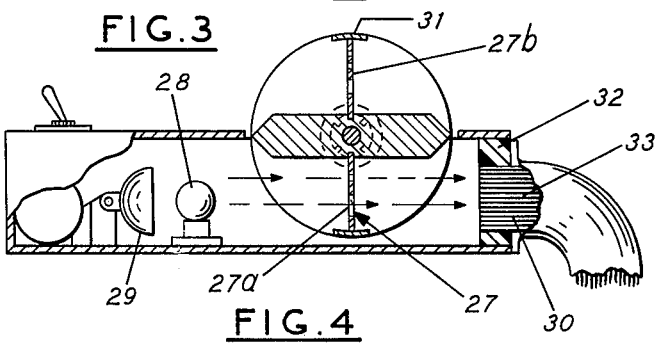
FIG. 4 is a section taken along line 4—4 of FIG. 3.

FIGS. 3, 4 and 5 illustrate the construction of stencil tab means 21 in more detail.

The purpose of the tab means 21 is essentially analogous to an optical encoder: e.g., the tab means 21 depicted in these figures is positioned to intercept light from incandescent lamp 28 in a controlled manner to generate light signals; these signals in turn pass to the indicating unit 17 at the typewriter console 10.

Now in more detail as shown in FIG. 3, note that the tab means 21 is seen to include a trio of spider frames 22 fitted with a common shaft 23. The ends of the shaft 23 are journaled at opposed side walls of support box 24. Since each spider frame 22 is free to rotate about common shaft 23, a plurality of light patterns, as corresponding to stencil card pairs 25, 26 and 27 housed therein can be selectively generated under control of the observer-user.

For convenience, identification of particular stencil cards in alignment with lamp 28 is required. As shown in FIG. 3 for this purpose, a set of transfer name tags 31 can be positioned at the viewable transverse edges of cards appropriate for identification of the mating cards that are being used as light encoders. For example, in FIG. 4, tag 31 is seen to be positioned at the transverse edge of card 27b, and identifies (to the observer-user) that the particular light pattern produced by its "active" card half, card 27a, is of a Δ configuration. Other light patterns are likewise easily identified. For example in FIG. 5, active stencil cards 25a and 26a of card pairs 25 and 26 are identified by similar tags corresponding to "$" and "π" patterns of light they generated.

In this invention, light generation is relatively straightforward: The light from the incandescent lamp 28 of FIG. 3 is first reflected via reflector 29 so as to pass as a beam through individual stencil cards comprising the active halves of the card pairs 25, 26, and 27. The resulting patterns each comprise a series of light signals. These signals then fall upon individual fiber optic encoding matrices 30 at the remote end of support box 24, in alignment with the card pairs 25, 26, and 27.

As shown in FIG. 4, fiber optic encoding matrices 30 include a common frame 32 for support of sets of conventional fiber optic light-conducting members 33. Each matrix 30 is seen to be positioned in axial alignment of reflector 29 and the active halves of the card pairs 25, 26 and 27, respectively. Within each matrix, the ends of the light-conducting members 33 are arranged as an array of orthogonal rows and columns of sufficient size for alphanumerical display, say 7 × 5. The dimensions of the array are such to provide an identical, undistorted display of each silhouette provided by the active half of each stencil card pair 25, 26 or 27. As a result, visible light (say, 4,000 to 13,000 A.) can be easily transmitted via the side walls of the sets of fiber optic members 33 to the indicating unit 17 of FIGS. 1 and 2.

Indicating Unit 17

Figure 6:
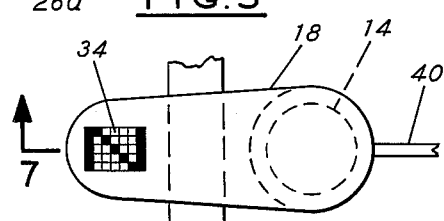
FIG. 6 is a plan view of a tab frame means attached to a selected key button of the typewriter console of FIG. 1.
Figure 7:
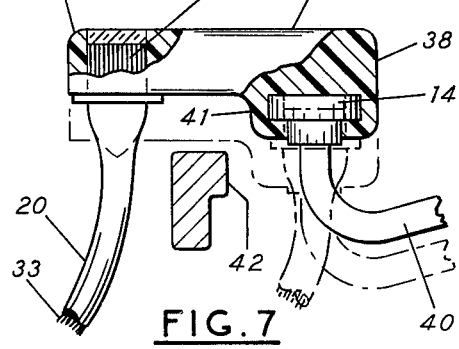
FIG. 7 is a section taken along line 7—7 of FIG. 6.

Indicating unit 17 is illustrated in detail in FIGS. 6 and 7.

As previously described, transfer bundle means 20 is composed of sets of light-conducting members 33. These light-conducting members 33 terminate at the display unit matrices, one of which that is typical being indicated at 34 in FIGS. 6 and 7. Support of the array matrix 34 is through the rigid frame means 18. The frame means 18 includes a cantilevered end 36 and a support end 38. The support end 38 attaches to a selected key button 14 as shown in FIG. 7. Over the central region of the frame 35 there is a reduction in thickness to form a step 41. In that way when the keyboard button 14 is depressed whereby key lever 40 is likewise downwardly depressed, there is sufficient clearance of these elements with regard to lip 42 of the typwriter housing 13.

Display matrix 34 is arranged in a matrix format identical to that of a corresponding encoding matrix 30. Since the generated alphanumeric display at the display matrix 34 is illuminated by light, the observer-user can easily observe the displayed character irrespective of the background lighting at the computer terminal.

While certain preferred embodiments of the invention have been specifically disclosed, it should be understood that the invention is not limited thereto. For example, if the dimensions of the fiber optic display matrix 34 are reduced, the supporting housing within each key button 14 may be sufficient to support the former. In such an arrangement, a selected key button 14 would be provided with a bore which would then accept the display array matrix. The resulting end array of fiber optic members 33 would be directly viewable by the observer-user. Accordingly, as many variations will be readily apparent by those skilled in the art, the invention should be given as broad as possible interpretation in terms of the following claims.

I claim:

1. A device for displaying alphanumeric light-emanating indicia at selected key buttons of a keyboard of a typewriter console forming an I/O link with a general-purpose digital computer, each light-emanating alphanumeric indicum being related to a font operational characteristic resulting from movement of one of said selected key buttons under control of a human observer-user whereby said font operational characteristic is permanently recorded on paper at said typewriter console in full view of said human observer-user through mechanical button-font-paper interaction, comprising a. an array of fiber optic, light-conducting members having near ends arranged to display at or adjacent to at least one of said selected key buttons said light-emanating alphanumeric indicium associated with said font operational characteristic, said alphanumeric indicium being of sufficient intensity so as to be easily discernible to said human observer-user using said typewriter console irrespective of the background lighting environment thereabout;

b. elongated rigid cantilevered frame means attached to and supportive of said array, said frame means including cooperative means in gripping contact with corresponding key buttons of said keyboard;

c. incandescent bulb means positioned at remote ends of said array of fiber optic, light-conducting members; and d. optical encoding means operatively connected to said array of fiber optic members and including cooperative means for aiding in the controlled generation of a series of encoded light signals which fall on more remote ends of said fiber optic, light conducting members in a pattern corresponding to said alphanumeric indicium for which display is sought.

2. In a device for displaying alphanumeric indicia at selected keys of a keyboard of a typewriter console forming an I/O link with a general-purpose computer, each indicium being related to a font operational characteristic resulting from depression of a selected key button under control of a human observer-user whereby said font operational characteristic is permanently recorded on paper at said typewriter console in full view of said human observer-user through mechanical button-font-paper interaction, the improvement comprising;
   a. an array of fiber optic, light-conducting members arranged with near ends viewable by said human observer-user to display said selected alphanumeric, light-emanating indicium adjacent to or at said selected key button, said displayed indicium being of sufficient light-emanating intensity as to be easily discernible by said observer-user irrespective of background lighting environment thereabout;
   b. elongated rigid cantilevered frame means attached to and supportive of said near ends of said array of fiber optic, light-conducting members, said frame means including cooperative means in gripping contact with a corresponding key button of said keyboard;
   c. encoding means selectively connected intermediate more remote ends of said array of light-conducting members including cooperative means for aiding in the controlled generation of a series of coded light signals falling on said remote ends of said fiber optic members in a pattern corresponding to said alphanumeric display indicium for which display is sought, said encoding means including incandescent bulb means connected to a source of energy and rotable stencil card means positioned intermediate said bulb means and said remote ends of said fiber optic, light-conducting members.

3. Device of claim 1 in which said end array of said series of fiber optic, light-emanating members is supported interior of said one key button of said keyboard, said array being viewable at the finger-touching surface of said one key button.

* * * * *